United States Patent [19]
Holmes et al.

[11] Patent Number: 5,972,145
[45] Date of Patent: Oct. 26, 1999

[54] REMOVABLE PASSIVATING POLYIMIDE COATING AND METHODS OF USE

[75] Inventors: Steven John Holmes, Milton; Harold George Linde, Richmond, both of Vt.

[73] Assignee: International Business Machines Corporation, Armonk, N.Y.

[21] Appl. No.: 08/660,567

[22] Filed: Jun. 7, 1996

[51] Int. Cl.$^6$ .................................................... B32B 31/00
[52] U.S. Cl. ..................... 156/155; 29/407.01; 29/424; 156/74; 156/331.5; 525/419
[58] Field of Search ........................... 156/741.55, 331.5; 29/407.01, 424; 528/335, 336; 525/419

[56] References Cited

U.S. PATENT DOCUMENTS

| | | |
|---|---|---|
| 3,179,614 | 4/1965 | Edwards . |
| 3,264,250 | 8/1966 | Gall . |
| 3,310,573 | 3/1967 | Coe . |
| 3,449,193 | 6/1969 | Bratton et al. . |
| 3,702,025 | 11/1972 | Archer ................................. 29/407.01 |
| 4,284,461 | 8/1981 | St. Clair et al. ..................... 156/331.5 |
| 4,783,695 | 11/1988 | Eichelber-ger et al. . |
| 4,908,086 | 3/1990 | Goodrich et al. . |
| 5,104,474 | 4/1992 | Scola et al. . |
| 5,114,754 | 5/1992 | Cronin et al. . |
| 5,178,964 | 1/1993 | Scola et al. . |
| 5,194,928 | 3/1993 | Cronin et al. . |
| 5,216,043 | 6/1993 | Sipinen et al. . |
| 5,262,229 | 11/1993 | Lampert et al. . |
| 5,300,812 | 4/1994 | Lupinski et al. . |
| 5,534,094 | 7/1996 | Arjavalingam et al. ................. 156/155 |

OTHER PUBLICATIONS

IBM/Burlington Technical Bulletin/Cation Interactions with polyamic Acids/By H.G Linde and R.T. Gleason/ Nov. 23, 1987.

Interaction of Polyamic Acids and. . . Copolymers/By–H.G Linde/ J. App. Polymer Sci. vol. 46, 353–361 (1992).

Y.H. Kim, G.F. Walker, J. Kim and J. Park\J. Adhension Sci. Tech. vol. 1, No. 4, pp. 331–339\1987\Adhesion and Interface Studies Between Copper and Polyimide.

Polyamic Acid Interaction With. . . Metal/By H.G. Linde/ J. App. Polymer Sci. vol. 40, 613–622 (1990).

Cation Interactions With Polyamic Acids/By IBM–H.G. Linde and R.T. Gleason.

*Primary Examiner*—John J. Gallagher
*Attorney, Agent, or Firm*—Schmeiser, Olsen & Watts; Mark P. Chadurjian

[57] ABSTRACT

Disclosed is the use of a removable passivating layer in multichip packaging and CUBE applications. The process takes advantage of the fact that various metal ions will react with the carboxylic acid groups of various polyimide precursors. The polyimide will cure at a first temperature and the system may be manipulated and tested. At a later point, the polyimide is subjected to a second, higher temperature in order to decompose or completely destroy the polyimide.

10 Claims, No Drawings

REMOVABLE PASSIVATING POLYIMIDE COATING AND METHODS OF USE

BACKGROUND OF THE INVENTION

1. Technical Field

This invention generally relates to a material used in forming a passivating layer in integrated circuit chips, and more specifically relates to a method of utilizing a removable passivating polyimide coating in situations where it is desirable to place the coating, manipulate the system with the coating in place, and then later remove the coating.

2. Background Art

Polyimides are used extensively in the microelectronics industry. Typically, polyimides are formed by the thermal curing of polyimide precursors, such as polyamic acids, and are used as passivation dielectrics on semiconductor devices (i.e. silicon chips). A problem associated with passivating a reactive metal substrate with a polyimide material by itself is the known interaction between the polyimide and the reactive metal. As reported in Linde, H. G. and R. T. Gleason, "Cation Interactions with Polyamic Acids," J. POLYMER SCI. B, Vol. 26, 1485–1497 (1989), D. Y. Shih, J. VAC. SCI. TECH., A7(3), 1402–1412 (1989), and Kim et al., "Adhesion and Interface Studies Between Copper and Polyimide," J. ADHESION SCI. TECH., Vol. 1, No. 4, 331–339 (1987), copper and other reactive metals form salts that retard thermal imidization and decompose the polyimide polymer during the high temperature curing step. But see U.S. Pat. No. 4,908,086, issued to Goodrich et al., on Mar. 30, 1990 (disclosing a polyimide adhesive mixed with a finely divided conductive metal to replace a gold-silicon eutectic die attach that will not decompose, even when the temperature is ramped up to 460° C.).

This decomposition was considered detrimental to the overall semiconductor device and, in fact, various inventions dealt with avoidance of the perceived problem. This was accomplished by either partially curing the polyimide precursor prior to adhering the metal layer or layering a first material onto the metal prior to depositing the polyimide precursors onto the first material. See U.S. Pat. No. 4,152, 195, issued to Bahrle et al., on May 1, 1979 (disclosing the method of partially curing the polyimide precursor prior to vapor deposition of the desired metal); U.S. Pat. No. 4,423, 547, issued to Farrar et al., on Jan. 3, 1984 (teaching the deposition of a silicon nitride onto a metal followed by the deposition of a thicker layer of polyimide); and U.S. Pat. No. 5,114,754, issued to Cronin et al., on May 19, 1992 (disclosing a process of applying a layer of silsesquioxane between the polyimide and the metal to passivate the metal and inhibit interaction between the metal and the polyimide precursor).

The advantage of placing a removable layer in certain applications has been perceived. For example, U.S. Pat. No. 4,783,695, issued to Eichelberger et al., on Nov. 8, 1988, discloses that in order to improve testability, it is desirable to place a layer of insulative adhesive onto a multichip integrated circuit package, test the package, and then later remove the insulative material should the multichip package fail. It will also allow for testing the layout of the multichip interconnects, and then allow the chips to be reused should that structure not prove to be optimal. Other patents disclose releasable adhesives, including U.S. Pat. No. 5,262,229, issued to Lampert et al., on Nov. 16, 1993 (disclosing a conductive releasable adhesive for electrostatic discharge controlled surfaces) and U.S. Pat. No. 5,216,043, issued to Sipinen et al., on Jun. 1, 1993 (disclosing a thermoplastic polymer combined with a transition metal salt to form an adhesive composition that will oxidatively degrade to an embrittled polymer), however, these releasable adhesives are not for use in semiconductor devices. Each of the articles and patents cited is incorporated herein by reference.

A second application is in the stacked and laminated semiconductor devices, commonly known as CUBES. In the process of manufacturing a CUBE, forty or more chips are formed into a large stack, which is then processed to form the edge wiring and connects. Subsequently, the large stack is segmented into shorter stacks of five or more chips. Presently, a non-polyimide adhesive layer such as DITAC (as sold by E. I. DuPont de Nemours of Wilmington, Del.) are used to allow cleavage at the chosen time. However, these materials suffer from drawbacks including: the additional process steps and tooling necessary to place the layer; and the fact that the non-polyimides have characteristics, for example solubility and glass transition temperatures, which are dissimilar from the polyimides, and, therefore, cause stress and contamination problems during the processing of the CUBES.

Therefore, there exists a need to provide a removable adhesive layer for semiconductor devices that could undergo the testing process, and yet could be selectively and easily removed when desired. This removable adhesive layer may be utilized as a simple passivating layer for multichip semiconductor device testing. Also, a need was seen in the CUBE technology for a removable adhesive that was thermally compatible with the polyimide passivating layers, so that regular processing could be performed on a stack of CUBES and then the individual CUBES could be released for use as a single CUBE.

DISCLOSURE OF INVENTION

It is against this background that the present invention provides a method of using a polyamic acid that has been doped with a suitable metal as a removable adhesive. According to the present invention, a polyamic acid passivating material is doped with reactive metal ions so that the doped composition imitates all the properties of the non-doped polyimide including a first curing temperature, until a post-cure bake is effected at a second, higher temperature, which is dependent on the concentration of the reactive metal ions in the doped precursor. The post-cure bake causes the doped composition to decompose, thus causing the surfaces that had initially been attached with this adhesive to separate. Further, with certain metals, the doped polyimide decomposes into volatiles, therefore, no trace of the polymer portion of the adhesive remains on the surfaces.

The foregoing and other features and advantages of the invention will be apparent from the following more particular description of the preferred embodiment of the invention.

BEST MODE FOR CARRYING OUT THE INVENTION

In accordance with the present invention, a polyimide precursor material is doped with an effective amount of a reactive metal salt such as cupric and is baked to a curing temperature in a system. After manipulation of the system, i.e. testing and/or processing, the system is baked to a post-cure temperature, which is higher than the curing temperature, and the polyimide that had reacted with the reactive metal ions decomposes into its volatile elements.

More particularly, the present process may utilize any one of a number of different polyimide precursor materials containing functional groups capable of reacting with selected cations, such as carboxylic acids or sulfonic acid groups. Preferred functional groups are carboxylic acid groups. Such polymers include polyamic acid polymers, polymers containing acid anhydride groups, as well as polyimides containing free carboxyl groups. Especially preferred are polyamic acid polymers, which are based on the condensation of aromatic dianhydrides with diamines, more preferably aromatic diamines. Suitable aromatic dianhydrides include pyromellitic dianhydride, 2,2-bis(3,4-dicarboxyphenyl) propane dianhydride, 2,3,6,7-naphthalene tetracarboxylic dianhydride, 2,2',3,3'-diphenyl tetracarboxylic dianhydride, benzophenone tetracarboxylic dianhydride, and fluorinated materials such as 2,2-hexafluoro-bis-(3,4-dicarboxyphenyl)propane dianhydride. Suitable diamines include m-phenylene diamine, p-phenylene diamine, 4,4'-diaminodiphenyl ether as well as fluorinated diamines such as 2,2-hexafluoro-bis-(4-aminophenyl) propane. The most preferred polyamic acid polymers include pyromellitic dianhydride-oxydianiline (PMDA-ODA) polyamic acid, biphenyldianhydride-p-phenylenediamine (BPDA-PDA) polyamic acid, or benzophenone tetracarboxylic acid dianhydride and ODA and/or m-phenylenediamine, although other aromatic polyamic acids known to those skilled in the art would be acceptable. These precursors may either be doped with a solution of metal salt, for example copper (II) nitrate ($Cu(NO_3)_2$) or any other soluble source of copper ions, diffused into the pre-formed amic acid film, or a source of reactive metal ions may be applied on the surface of the substrate from which the adhesive is to be removed. The source of metal ions may be a thin layer of the elemental metal which is applied to the surface of the substrate. The pH of the dopant solution is important in the amic acid diffusion process because high pH dissolves the film and low pH does not favor ion exchange. Depending on the concentration of the metal ions and the atmospheric conditions the processing is taking place at, the metal ions may react with the carboxylic acid groups of the polyamic acids and cause the polyimide to decompose at temperatures of about 400° C. and higher.

The presence of the metal ions may cause the polyimide to completely vaporize into its volatile components, as is the case with copper ions, or it may simply cause the polyimide to become brittle, in which case a minimal amount of force is necessary to separate the layers. It has been found that suitable metal ions include: potassium, lithium, magnesium, cobalt, nickel, calcium, copper, and lead. Advantageously, a copper (II) nitrate (Cu $(NO_3)_2$) solution may be used. Other acids, including carbonates, phosphates, and sulfates of the reactive metal ions may also be utilized. In fact, tap water, with the presence of trace amounts of various metal salts, is frequently an adequate source of reactive metal ions.

In the temporary adhesive application for CUBES, i.e. stacked and laminated integrated circuit chips, the adhesive will be laminated to the interface between smaller CUBES such that they can be laminated into larger CUBES. This allows multiple small CUBES to be processed simultaneously throughout the passivation and wiring sectors for CUBE manufacture. This simultaneous processing of several smaller CUBES as a single large CUBE decreases the overall cycle time, so that the production rate is increased. Cycle time is reduced because the entire stack of CUBES passes through each process at a single time, which eliminates much of the handling and delays involved in the production process. This reduction in handling and delays not only enhances cycle time, but also tends to increase the yield of the CUBES because there are fewer defects introduced through handling the CUBES. In addition, CUBE yield is enhanced by the elimination of process variables related to the uncontrolled delays which are created when the CUBES are processed separately as individual units in the production line. The processing characteristics of the materials used in the production of the CUBES can vary depending on extent of time elapsed from one processing step to the next. By combining smaller CUBES into a single large CUBE, these delays are reduced and more repeatable, thus reducing process variability.

Presently, chips that are intended for CUBE manufacture are patterned with a wiring layer to bring the chip Input and Output devices to the edge of the chip. This patterning occurs before the chips are diced from the wafer. An adhesive layer is spin-applied onto the wafer surface and partially cured prior to dicing the chips. After the chips are diced from the wafer, they are loosely stacked into a fixture in the orientation they will occupy in the CUBE. The partially cured adhesive on the surface of each chip serves to bind the chips together into the CUBE when the lamination process is complete.

Each individual CUBE contains a cap chip. The cap chip serves to provide an input/output link from the chips in the CUBE to external devices. A long stack is formed when multiple short CUBES are laminated into a single unit. A long stack is formed by spin-applying an adhesive material to the individual cap chips before they are diced from their substrate material. After dicing, the individual cap chips are placed on one end of a short CUBE, the short CUBES are placed one on top of the other, and the whole unit is laminated together to form the long stack.

In the present invention, this cap chip substrate is coated with the temporary adhesive material, and partially cured before dicing. In current practice, these cap chips are coated with the current removable adhesive material, i.e., DITAC by E. I. DuPont de Nemours, Inc. of Wilmington, Del., and the stack of CUBES is processed.

In the present invention, the polyimide precursor-reactive metal ion mixture is prepared in a suitable inert solvent, and then the solution is applied to the first substrate layer, in CUBES this would be the ceramic cap chip, by spin coating, at a spin speed of approximately 2,000–5,000 rpm, depending on the desired thickness. Typically a spin speed of about 3,000 rpm is suitable. Alternatively, the mixture may be silk screened, bladed, or painted onto the first substrate layer. The solvents are not unduly limited, and a number of solvents or solvent mixtures may be used, for example, N-methyl pyrrolidinone (NMP), dimethyl acetamide (DMAc), dimethyl formamide (DMF), dimethyl sulfoxide (DMSO) or suitable mixtures of these solvents with various conventional hydrocarbon solvents.

After applying the solution, the second substrate layer, i.e., a bottom memory chip for a second CUBE, is placed on top of the first substrate layer, forming a composite. Each of the substrate layers is attached to a CUBE stack, which also contains intercalary layers of uncured polyimide precursor material, however, these layers are not doped with reactive metal ions. The composite is then heated to cure the polyamic acid polyimide precursor material. During this step, the polyamic acid is imidized to the corresponding polyimide. The actual curing conditions, i.e. temperature, pressure, and time, may vary over wide ranges and are generally dependent on the polyamic acid and the desired thickness of the cured polyimide layer being produced, as well as other factors which would be apparent to those skilled in the art. Temperatures of at least 200° C. are normally required to cure the polyamic acid polyimide precursor materials into polyimides, and, therefore, the cure is accomplished at greater than 200° C.

In a preferred embodiment, the initial heat treatment is performed in a series of steps at atmospheric pressure. In this manner, the substrate is exposed to a temperature of about 85–160° C., or sequential temperatures within that range, to drive off solvent, and then to a final, high temperature cure of about 350° C. at approximately 100 psi to form the final cured layer.

If the reactive metal ion doped polyamic acid is being used in other applications, the standard method of applying and curing for that application is followed. For example, if the temporary adhesive is to be used to form a temporary film on the surface of integrated circuit chips for the purpose of testing the chip and the interconnect patterns, the temporary adhesive could be substituted for the polyimide or other passivation material that would normally be used. The polymer layer would be applied to the substrate in the normal manner, akin to the manner in which the overlay layer of the Eichelberger et al. patent is applied. Rather than having to perform intricate removal steps for the layers, a single cure of over 400° C. would effectively remove the temporary adhesive and the chips would then be easily reusable.

More specifically, the chips would be adhered to a suitable substrate, for example a glass, metal, ceramic, plastic, silicon, or composite substrate as are known to those skilled in the art. The chips comprise interconnect pads thereon for the purpose of forming electrical connections at various points. The polymer film would be applied onto the entire package, including both chips and substrate. Vias would then be etched through the polymer film, at points over the interconnect pads so that the interconnect pads would be exposed to the surface. The next step would be to dispose interconnect conductors on the surface of the polymer film and attach the conductors to the chip pads to provide electrical connection between the various chips. The entire package is then tested for optimality and it is determined whether any individual chip failed. If any chip failed or the testing package is not optimally wired (shorts occurred or the lengths of the various interconnects were too long, and could be minimized in an alternative feasible pattern) the entire package could be baked at a second, higher temperature than the cure temperature and the polyimide passivating layer would decompose into its volatile components so that the individual chips that were functional could be reused. This method is subject to more limitations than the CUBE splitting method of using the removable passivating material, because the concentrations of the metal must be limited so the passivating material does not become conductive. The metal selection is also more limited because certain metals may be more conductive than others. It has been found that copper is a preferred material because it forms the non-conductive cuprous oxide when subjected to the final curing temperatures.

The following example is provided to illustrate the invention.

EXAMPLE

Samples of RC-5878 (by E. I. DuPont de Nemours), a polyamic acid/polyimide, were mixed with varying amounts of $Cu^{++}$ (0.5M) in NMP. The initial mixtures were evaluated for viscosity and suitability for forming a continuous film. If too viscous, the formulation was mixed in a 1:1 ratio with NMP to form a suitable solution for wafer spin application. The solution was spin applied at about 3000 rpm to silicon wafers that had been first primed using an aqueous solution of 0.1% 3-aminopropyltriethoxy silane. The adhesion was tested after curing the polyimide at 400° C. for 1.5 hrs., using "Scotch Tape" that was pressed on the polyimide films and then peeled off. Substrate adhesion failure is demonstrated when the polymer film delaminates from the silicon surface and adheres to the "Scotch Tape". Further, the amount of film remaining after attaining 400° C. was measured by thermogravimetric analyses and the rate of weight loss per hour was determined. The results of these tests are summarized in the table below:

|   | g 5878 | ml 0.5M $Cu^{++}$ sol'n. | mole % $Cu^{++}$ | Initial character of mixture | Weight % loss per hour at 400° C. | Peel at 350° C. | Peel at 400° C. |
|---|---|---|---|---|---|---|---|
| 1 | 1.93 | 0.50 | 25.29 | Thick but fluid | 21.45 |  | Gone |
| 2 | 2.08 | 0.30 | 15.85 | Somewhat fluid | 14.16 |  | Gone |
| 3 | 2.13 | 0.20 | 10.93 | Soft jelly | 8.94 | No peel | Peel |
| 4 | 2.27 | 0.10 | 5.44 | Hard jelly | 1.71 | No peel | Peel |
| 5 | 2.27 | 0.05 | 2.79 | Most jelly like | 0.09 | No peel | No peel |

From the above table, thermogravimetric analysis (TGA) shows clear polymer decomposition above 5 mole % $Cu^{++}$ when heated to 400° C., therefore, depending on the application, an effective amount of copper metal ions with these reagents could be any concentration greater than about 5 mole %. At the more elevated concentrations of metal ions, i.e., greater than 20 mole %, the scotch tape tests were performed after subjecting the film to 195° C. for 15 min. and the film did not peel. After being exposed to 350° C. for 1.2 hrs., the polyimide film was essentially decomposed, giving only weak IR absorption for the polyimide. Therefore, if the film will be subjected to temperatures of 350° C. during the regular processing of the remainder of the system, to effect a cure, it would appear that it would be advantageous to select a concentration of copper (or other reactive metal) ions below 20 mole %. The data also show adhesion loss at 400° C. between 5 and 12 mole % $Cu^{++}$ using the scotch tape peel test. Above 12 mole % $Cu^{++}$, the polyimide layer is completely decomposed after being baked at 400° C. for 1.5 hrs. After processing, however, the copper does remain on the substrate surface as cuprous oxide ($Cu_2O$), in amounts greater than 2 atom % by Auger analysis.

It has been found that these reaction parameters may vary depending on a number of different factors including: the concentration of the metal ions, the temperatures the doped polyimide is subjected to, the amount of time the doped polyimides are subjected to the elevated temperatures, and the amount of oxygen in the atmosphere the substrate is being processed in. As the concentration of the metal ions and the amount of oxygen in the atmosphere increases, the temperature at which the polyimide will decompose decreases as does the amount of time it takes to decompose the polyimide. The lower the concentrations of reagents, the higher the temperature and the longer the time it takes. By selecting the proper concentration of metal ions and oxygen, the system can be regulated so that the polyimide will withstand regular processing conditions, i.e., up to 350° C. for the final cure, while still allowing the polyimide to be decomposed at temperatures that will not negatively affect the underlying structure.

There must be a sufficient amount of the reactive metal ion to effect the decomposition of the polyimide. This amount may range as low as about 1 mole %, as is exemplified by the experiments in which the trace amounts (in ppm) of the metal ions effected the decomposition of the polyimide film after a sufficiently long cure. On the other hand, the mole % can range as high as about 50%, so long as there is sufficient polyimide to give good adhesion to the substrate during all processing steps.

While the invention has been particularly shown and described with reference to a preferred exemplary embodiment thereof, it will be understood by those skilled in the art that various changes in form and details may be made therein without departing from the spirit and scope of the invention.

Accordingly, what is claimed is:

1. A method of temporarily bonding two surfaces together comprising the steps of:
   a. preparing a suitable polyimide precursor including a small proportion of a reactive metal salt;
   b. applying a layer of the precursor onto a first semiconductor surface to be temporarily adhered;
   c. placing a second semiconductor surface in contact with the layer of the precursor on the first surface;
   d. subjecting the precursor to a first temperature to provide a cured polyimide adhesive which adheres the surfaces; and
   e. subsequently subjecting the cured polyimide to a second, higher temperature to effect decomposition of the polyimide, wherein the decomposition of the polyimide results in the release of the surfaces.

2. The method of claim 1, further comprising the step of selecting the reactive metal salt from the group of metals consisting of: sodium, potassium, lithium, magnesium, cobalt, nickel, calcium, copper and lead.

3. The method of claim 1, further comprising the step of selecting the polyimide precursor from polymers containing functional groups capable of reacting with selected cations.

4. The method of claim 3, wherein the selection of the polymers containing functional groups capable of reacting with selected cations is from polymers containing carboxylic acid groups.

5. The method of claim 4, wherein selecting of the reactive polymer is from the group consisting of polyamic acid polymers, based on the condensation of dianhydrides with diamines.

6. The method of claim 5, wherein the dianhydrides are selected from the group consisting of: pyromellitic dianhydride, 2,2-bis(3,4-dicarboxyphenyl) propane dianhydride, 2,3,6,7-napthalene tetracarboxylic dianhydride, 2,2',3,3'-diphenyl tetracarboxylic dianhydride and benzophenone tetracarboxylic dianhydride.

7. The method of claim 5, wherein the diamines are selected from the group consisting of: m-phenylene diamine, p-phenylene diamine and 4,4'-diaminodiphenyl ether.

8. The method of claim 1, wherein the first and second surfaces are silicon.

9. A method of temporarily bonding two surfaces together comprising the steps of:
   a. preparing a suitable polyimide precursor;
   b. applying a layer of the precursor onto a first semiconductor surface to be temporarily adhered;
   c. diffusing an amount of metal ions into the layer of the precursor;
   d. placing a second semiconductor surface in contact with the layer of the precursor on the first surface;
   e. subjecting the precursor to a first temperature to provide a cured polyimide adhesive which adheres the surfaces; and
   f. subsequently subjecting the cured polyimide to a second, higher temperature to effect decomposition of the polyimide, wherein the decomposition of the polyimide results in the release of the surfaces.

10. A method of temporarily bonding two surfaces together, comprising the steps of:
   f. providing a polyimide precursor including an amount of a reactive metal salt, wherein the polyimide precursor cures to an adhesive at a first temperature and decomposes at a second higher temperature;
   g. temporarily bonding the two surfaces together by:
      1) applying the precursor to a first surface;
      2) applying a second surface over the precursor;
      3) subjecting the precursor to the first temperature to provide a cured polyimide adhesive; and
   h. decomposing the cured polyimide by subsequently subjecting the cured polyimide to a second higher temperature, separating the two surfaces.

* * * * *